(12) United States Patent
Wessendorf

(10) Patent No.: US 10,566,936 B1
(45) Date of Patent: *Feb. 18, 2020

(54) SUPPLY-NOISE-REJECTING CURRENT SOURCE

(71) Applicant: National Technology & Engineering Solutions of Sandia, LLC, Albuquerque, NM (US)

(72) Inventor: Kurt O. Wessendorf, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/016,818

(22) Filed: Jun. 25, 2018

Related U.S. Application Data

(63) Continuation-in-part of application No. 15/660,296, filed on Jul. 26, 2017, now Pat. No. 10,090,826.

(51) Int. Cl.
| | | |
|---|---|---|
| *H03F 1/30* | (2006.01) | |
| *H03F 3/45* | (2006.01) | |
| *G05F 1/46* | (2006.01) | |
| *H03F 3/345* | (2006.01) | |
| *G05F 3/26* | (2006.01) | |

(52) U.S. Cl.
CPC ............ *H03F 1/308* (2013.01); *G05F 1/467* (2013.01); *G05F 3/262* (2013.01); *H03F 3/345* (2013.01)

(58) Field of Classification Search
USPC ......................................... 330/252–261, 288
See application file for complete search history.

(56) References Cited

U.S. PATENT DOCUMENTS

| | | | |
|---|---|---|---|
| 4,994,730 A | 2/1991 | Rossi et al. | |
| 5,266,887 A | 11/1993 | Smith | |
| 5,412,309 A | 5/1995 | Ueunten | |
| 5,710,522 A | 1/1998 | Pass | |
| 5,936,460 A | 8/1999 | Iravani | |
| 6,329,878 B1 | 12/2001 | Edwards et al. | |
| 7,193,456 B1 | 3/2007 | Aude | |
| 7,295,068 B2 | 11/2007 | Capofreddi et al. | |
| 7,508,184 B2 * | 3/2009 | Yen ........................ | G05F 3/262 323/314 |
| 8,841,970 B2 | 9/2014 | Mehrabi et al. | |

* cited by examiner

*Primary Examiner* — Hieu P Nguyen
(74) *Attorney, Agent, or Firm* — Samantha Updegraff; Mark A. Dodd

(57) ABSTRACT

Various technologies pertaining to a high-impedance current source are described herein. The current source outputs a substantially constant current by way of a first transistor that draws current from a supply. The current source is configured to feed-back noise from the supply to a feedback resistor at an input of an operational amplifier (op-amp) by way of a second transistor. The feedback resistor and the op-amp are configured such that responsive to receiving the supply noise feedback, the op-amp drives a gate voltage of the first transistor to cause the first transistor to reject the supply noise and cause the output of the current source to remain substantially constant.

20 Claims, 5 Drawing Sheets

SUPPLY-NOISE-REJECTING CURRENT SOURCE

CROSS-REFERENCE TO RELATED APPLICATION

This application is a continuation-in-part of U.S. application Ser. No. 15/660,296, filed Jul. 26, 2017, which is incorporated herein by reference in its entirety.

STATEMENT OF GOVERNMENTAL INTEREST

This invention was made with Government support under Contract No. DE-NA0003525 awarded by the United States Department of Energy/National Nuclear Security Administration. The Government has certain rights in the invention.

BACKGROUND

Current sources provide a fixed current, or a current dependent on some known control input (e.g., a control voltage input). An ideal current source has infinite impedance looking into either of its two terminals. Conventional practical current sources realized with transistors generally have asymmetric impedance, wherein an impedance looking into a first terminal of the current source can be orders of magnitude greater than an impedance looking into a second terminal. In some applications, current sources require sourcing current from positive or negative voltage supply rails. However, voltage supply rails are inherently noisy because they are generated by active circuits. While a conventional current source may have a high impedance looking into an output terminal of the conventional current source, the asymmetric impedance of the conventional current source causes the output current of the conventional current source to be poorly isolated from voltage noise on the supply rails. Voltage supply noise transferred to the output of a conventional current source can have a magnitude several times greater than the intrinsic electronics noise of the current source itself and can therefore dominate the noise performance of a given electronic system. Thus, conventional current sources may be unsuitable for some applications requiring very low-noise operation due to feedthrough power supply noise.

SUMMARY

The following is a brief summary of subject matter that is described in greater detail herein. This summary is not intended to be limiting as to the scope of the claims.

A supply-noise-rejecting current source is described herein, wherein the current source has a substantially symmetric impedance at both drive level terminals of the output device, e.g., drain and source. The current source uses a feedback technique to apply the noise on the respective power supply to the gate (or base for a bipolar transistor) of the current source output transistor, over a controllable bandwidth. This action, independent of the transistor current or added source impedance, rejects supply noise feeding through to the current-source output, the drain. The current source outputs a substantially constant current by way of a first output transistor that draws current from a supply. The current source is configured to feed-back noise from the supply to a feedback resistor at an input of an operational amplifier (op-amp) by way of a second transistor. The op-amp and the second transistor are configured such that responsive to receiving the supply noise feedback, the op-amp drives a gate voltage of the first transistor to cause the output of the current source to remain substantially constant. In an exemplary embodiment, the feedback resistor is connected to a first input terminal of the op-amp and a ground reference node, and a control voltage is connected to a second input terminal of the op-amp. A drain of the second transistor is connected to the feedback resistor and the first input of the op-amp, a gate of the second transistor is connected to an output terminal of the op-amp and the gate of the first transistor, while a source of the second transistor is connected to the supply. Noise on a voltage supply induces a current from the source to the drain of the second transistor causing a change in voltage at the first input of the op-amp via the feedback resistor. Responsive to the change in voltage at the first op-amp input, the op-amp drives its output to equalize the voltage at the first op-amp input to the second op-amp input. The op-amp thus outputs a voltage at the gate of the first and second transistors that is approximately equal to the noise voltage generated by the supply. In turn, this causes the first transistor to reject noise output by the supply.

In another exemplary embodiment, a current mirror can be configured to increase an output impedance of the current source at the output terminal of the current source by feeding back stimulation received at the output terminal to the feedback resistor connected to the first input of the op-amp. When the output stimulation is fed back to the resistor at the first input of the op-amp, the op-amp drives its output voltage at the gate of the output transistor to maintain the output current to a substantially constant level.

In another embodiment, a third transistor forms a current mirror with the second transistor. The current mirror is configured to increase an output impedance of the current source at the output terminal of the current source. A source of the second transistor is connected to the supply, and a drain of the second transistor is connected to the input of the op-amp. A source of the third transistor is connected to the supply, a gate of the third transistor is connected to a gate of the second transistor, and a drain of the third transistor is connected to the source of the first transistor. In this embodiment, a fourth transistor cascodes the second transistor to form a symmetrical voltage-balanced current mirror.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
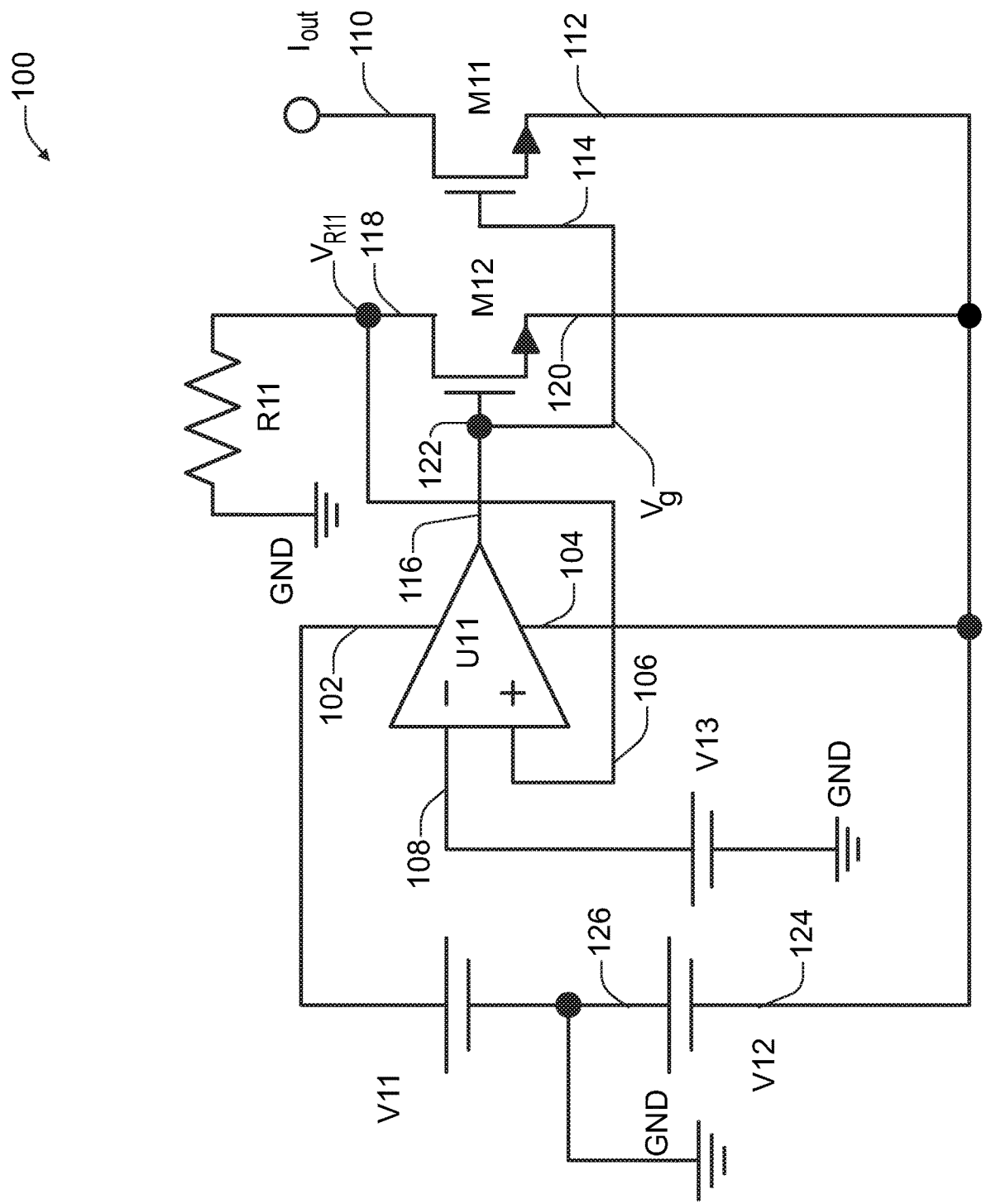
FIG. 1 is a circuit diagram of an exemplary supply-noise-rejecting current source.

Various technologies pertaining to a current source with a high and relatively symmetric input and output impedance are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something, and is not intended to indicate a preference.

With reference to FIG. 1, an exemplary system 100 that functions as a supply-noise-rejecting current source is illustrated. The system 100 includes a first voltage supply V11 and a second voltage supply V12 connected to a common ground reference node GND. In exemplary embodiments, the voltage supplies V11, V12 are positive and negative supply rails of a voltage supply unit (not shown). The system 100 further comprises an operational amplifier (op-amp) U11. In an example, the op-amp U11 comprises an operational transconductance amplifier (OTA). For the purposes of description of the exemplary systems described herein, op-amps will be described as having characteristics of ideal op-amps (i.e., infinite impedance at each input terminal, infinite gain and identical voltage at each input terminal), however it is to be recognized that practical op-amps exhibit some non-ideality. The OTA differs from a generic op-amp in that it does not have a low output impedance final stage. The op-amp U11 is connected to the first voltage supply V11 at a first supply terminal 102 of the op-amp U11. The op-amp U11 is further connected to the second voltage supply V12 at a second supply terminal 104 of the op-amp U11. The system 100 further includes a resistor R11 that is connected to a first input terminal 106 of the op-amp U11 and a control voltage source V13 that is connected to a second input terminal 108 of the op-amp U11. The system also comprises a first transistor M11 and a second transistor M12, shown as NMOS transistors. In the exemplary system 100, a drain 110 of the first transistor M11 is an output terminal of the current source, sourcing a current $I_{out}$. A source 112 of the first transistor M11 is connected to the second voltage supply V12, and a gate 114 of the first transistor M11 is connected to an output 116 of the op-amp U11. A drain 118 of the second transistor M12 is connected to the resistor R11 and the first input 106 of the op-amp U11. A source 120 of the second transistor M12 is connected to the second voltage supply V12, and a gate 122 of the second transistor M12 is connected to the output 116 of the op-amp U11 and the gate 114 of the first transistor M11.

Operation of the exemplary system 100 is now described. The system 100 is configured to drive a voltage $V_g$ on the gate 114 of the first transistor M11 to match supply noise from the second voltage supply V12 that sources current to the first transistor M11. By way of example, voltage $V_g$ of system 100 can have an amplitude and a phase approximately equal to supply noise from the current-sourcing voltage supply V12. The second voltage supply V12 can be configured to have a DC or AC voltage characteristic. For example, the voltage supply V12 can be configured to have a constant DC voltage of −5V from a negative terminal 124 to a positive terminal 126 of the supply V12 (the positive terminal 126 connected to the ground reference node GND). In addition to the configured output of the supply V12, the supply outputs some noise that is ordinarily a small fraction of the configured output. By way of example, if the supply V12 is configured to have a DC voltage output of −5$V_g$, the supply V12 can output noise having an RMS value of approximately 30 μN. Voltage supply noise is generally low frequency (e.g., 10 Hz to 10 kHz) and 1/f in nature. The first transistor M11 outputs a substantially constant current $I_{out}$ (e.g., a constant DC current±0.1%, a time-varying AC current±0.1% RMS), a value of which depends upon a resistance value of the resistor R11 and a voltage output of the voltage source V13.

The second transistor M12 is configured to feed-back supply noise from the supply V12 to the resistor R11. When voltage supply noise occurs on the voltage supply V12, a current flows through the source 120 and drain 118 of the second transistor M12. Since current does not flow into the input terminals of the op-amp U11, the current that flows through the second transistor M12 also flows through the resistor R11, yielding a voltage change at $V_{R11}$, the voltage across the resistor. The op-amp U11 outputs a voltage $V_g$ at its output terminal 116, which is approximately equal to the supply noise voltage output by V12. The voltage $V_g$ causes the current through the transistor M12 to change so that the voltage $V_{R11}$ is equal to the control voltage V13, therefore the output current, $I_{out}$ will equal V13/R11 for this example. The voltage $V_g$ is applied to the gate 114 of the first transistor M11 and the gate 122 of the second transistor M12. Since the voltage $V_g$ is approximately equal to the supply noise voltage output by V12 in amplitude and phase, the gate-to-source voltage of each of the transistors M11, M12 with respect to the time-varying supply noise voltage is approximately zero. Thus, the impedance of the transistor M11 with respect to the supply voltage noise from V12 is very high (e.g., on the order of 100 kΩ or MΩ), and the transistor M11 rejects the supply noise. Therefore, feeding back the supply noise from the supply V12 to the resistor R11 by way of the second transistor M12 causes the output voltage $V_g$ at the output 116 of the op-amp U11 approximately equal the supply noise, and causes the first transistor M11 to reject the supply noise from V12. The system 100 therefore functions as a symmetric impedance current source, since the transistor M11 has a high impedance (e.g., 100's kΩ to MΩ's) looking into its output terminal, the drain 110, and a high impedance (e.g., 100's kΩ to MΩ's) relative to the supply V12.

Figure 2:
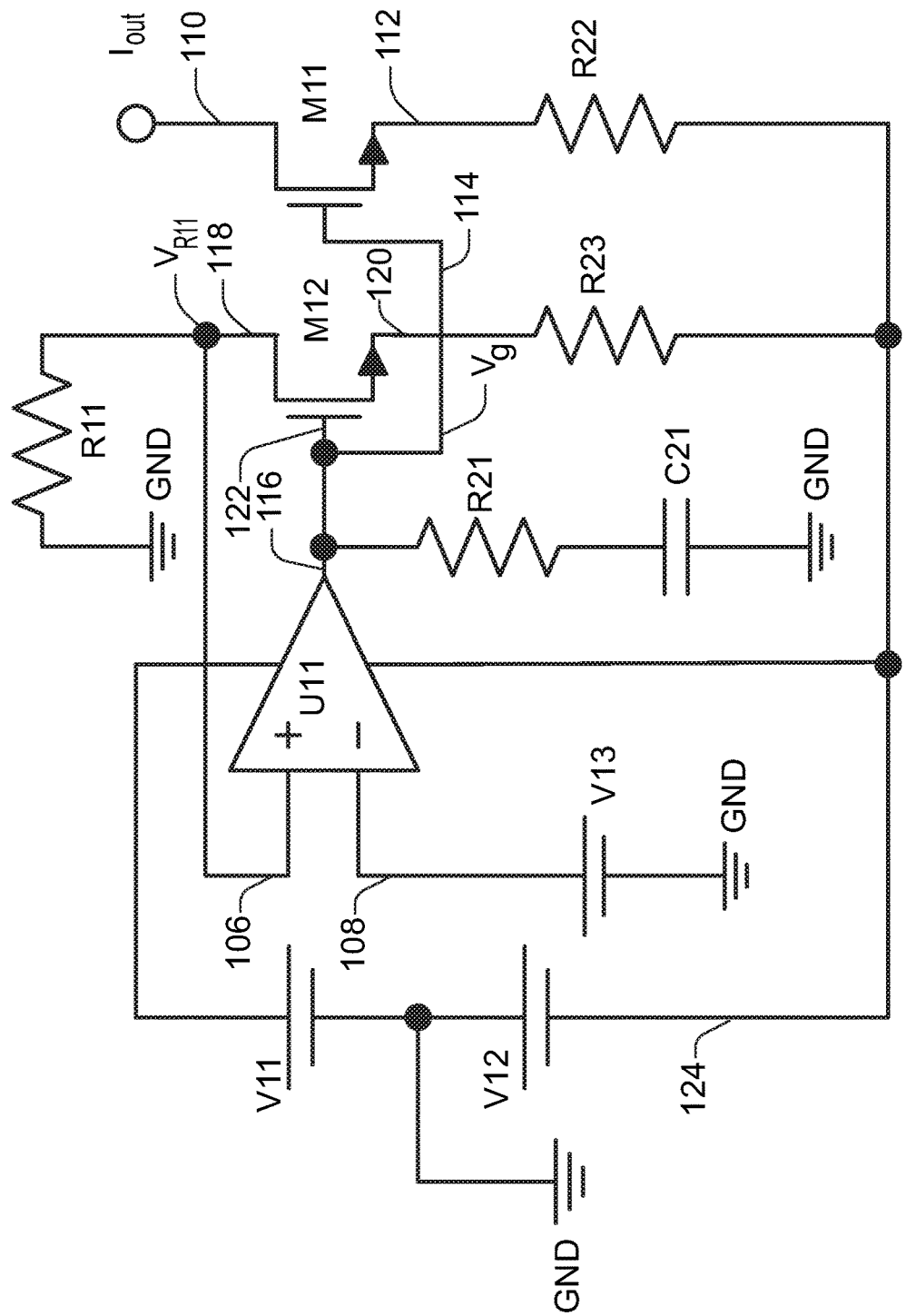
FIG. 2 is a circuit diagram of another exemplary supply-noise-rejecting current source.

Referring now to FIG. 2, an exemplary system 200 functioning as a supply-noise-rejecting current source is illustrated wherein the system 200 is tuned for various operating parameters. The system 200 includes the voltage supply sources V11 and V12 connected to the ground reference node GND, the op-amp U11, the control voltage source V13, the first and second transistors M11, M12, and the feedback resistor R11, connected to one another as in the system 100.

The system 200 additionally includes resistors R21, R22, R23 and a capacitor C21. The resistor R21 and the capacitor C21 are connected in series, wherein the resistor R21 is connected to the output terminal 116 of the op-amp U11 and the gates 114, 122 of the first transistor M11 and the second transistor M12, respectively. The capacitor C21 is connected between the resistor R21 and ground. The resistor R21 and the capacitor C21 are chosen to select an operational bandwidth and noise-bandwidth of the feedback loop from the output 116 of the op-amp U11 to the first input 106 of the op-amp U11. Below the bandwidth frequency, the system 100 drives the voltage $V_g$ to approximately equal the supply noise from the supply V12, and therefore the first transistor M11 has a high symmetric impedance from the output $I_{out}$ and from the voltage supply V12, as described above with respect to FIG. 1. The resistor R22 is connected between the source 112 of the first transistor M11 and the negative terminal 124 of the voltage supply V12. The resistor R23 is connected between the source 120 of the second transistor M12 and the negative terminal 124 of the voltage supply V12. The resistors R22 and R23 can be included in the system 200 to reduce electronics noise associated with the transistors M11 and M12 and also increase the current source impedances at output node 110. In particular, electronics noise associated with using discrete transistor components for the transistors M11 and M12 can be reduced by including the resistors R22 and R23. In integrated circuit implementations (e.g., application-specific integrated circuits, or ASICS), electronics noise can be reduced through control of physical specifications of the transistors M11 and M12 (e.g., geometry of gates, sources, drains, etc.). Resistance values of the resistors R22 and R23 can be independently selected based upon design considerations for a particular application of the current source 200.

Figure 3:
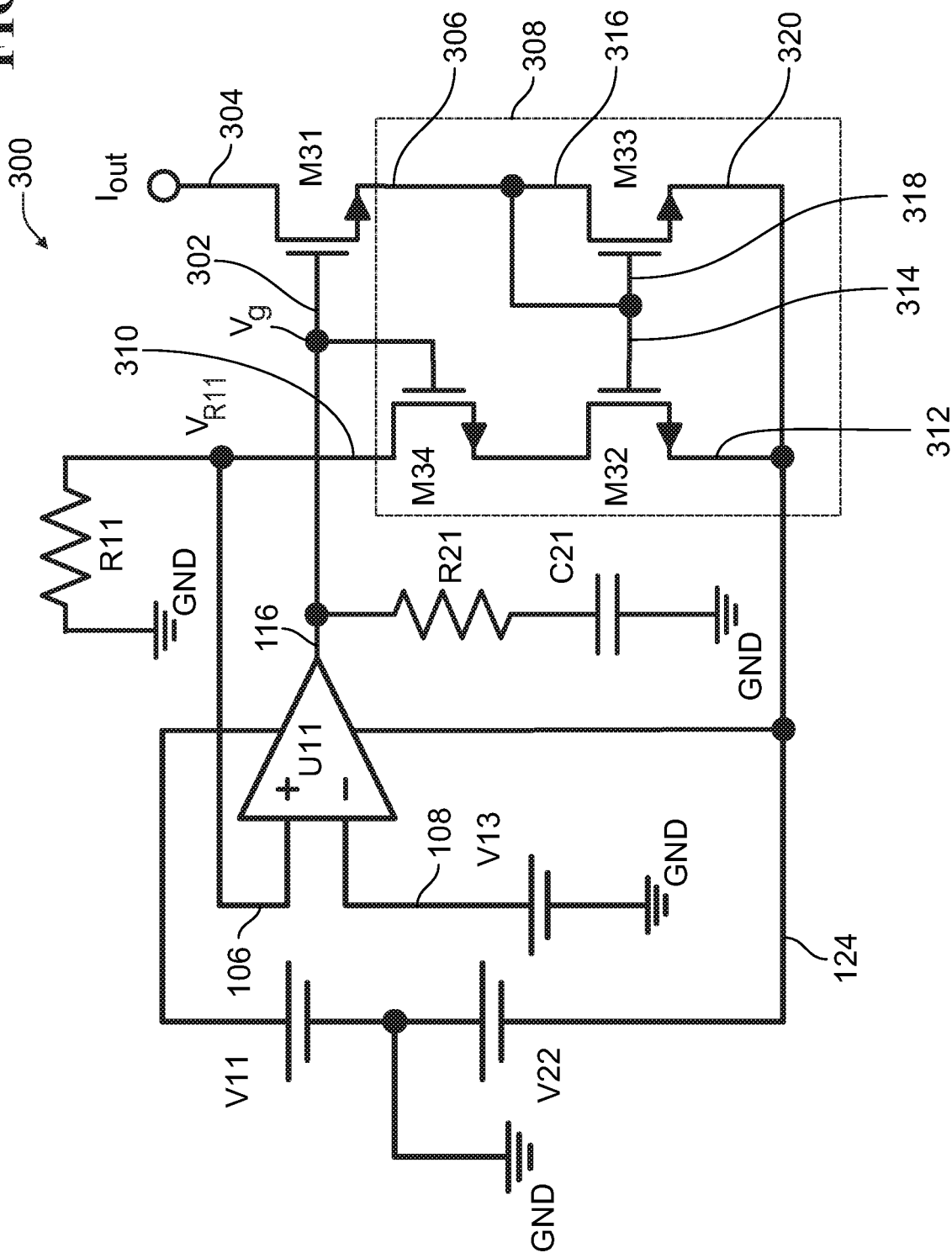
FIG. 3 is a circuit diagram of yet another exemplary supply-noise-rejecting current source.

Referring now to FIG. 3, an exemplary system 300 that functions as a current source is shown wherein a current mirror is used to increase an output impedance of the current source. The current mirror feeds back stimulation received at the output of the system 300 to a feedback resistor connected to an op-amp, where the op-amp is configured to output the stimulation to the gate of an output transistor. The system 300 comprises the voltage supplies V11, V22, connected to ground reference node GND and the op-amp U11 as in the systems 100, 200; the resistor R11 connected to the first input terminal 106 of the op-amp U11; the control voltage source V13 connected to the second input terminal 108 of the op-amp U11; and the resistor R21 and capacitor C21 connected between the output terminal 116 of the op-amp U11 and the ground reference node GND.

The exemplary system 300 further comprises a first output transistor M31 wherein a gate 302 of the first transistor M31 is connected to the output terminal 116 of the op-amp U11. The drain 304 of the first transistor M31 functions as an output terminal of the current source, while a source 306 of the first transistor M31 is connected to a current mirror 308. As in the exemplary system 100, the first transistor M31 outputs a substantially constant current $I_{out}$ that depends upon a resistance of the resistor R11 and a voltage of the voltage source V13. The current mirror 308 is configured to increase an impedance of the current source 300 looking into the output terminal at the drain 304 of the first transistor M31 by feeding back stimulation received at the drain 304 of the first transistor M31 to the resistor R11. For example, feeding back the output stimulation to the first input terminal 106 of the op-amp U11 by way of the current mirror 308 can increase the output impedance of the current source looking into the output terminal 304 from an impedance on the order of MΩ's to many 10's of MΩ.

The current mirror 308 comprises a second transistor M32, a third transistor M33, and a fourth transistor M34. The gate of the second transistor M32, 314 is connected to the gate and the drain of third transistor M33, 318 and 316 respectively. The sources of transistors M32 and M33, nodes 312 and 320 respectively are connected to the supply voltage, V22, node 124. The fourth transistor M34 cascodes the second transistor M32 via the gate of the first transistor M31, 302. This configuration makes second transistor M32 and third transistor M33 function as a current mirror cascoded by fourth transistor M34. Fourth transistor M34 cascodes the drain of second transistor M32 and provides the feedback current to resistor R11. With second transistor M32 matched to third transistor M33 and first transistor M31 matched to fourth transistor M34, the open loop impedances at transistor sources 312 and 320 are equal and symmetrical, this allows very high supply noise rejection in this closed loop circuit. The fourth transistor M34 is therefore configured to feed-back supply noise induced current from the supply V22, 124, to the feedback resistor R11 via a drain, 310, whereupon the op-amp U11 outputs a signal to the gate of M31, node 302, that forces the drain current of M31 to be independent of the ac voltage (noise) from V22 on node 124.

The feedback loop of this circuit forces the voltage at R11, node 310 to be substantially constant thereby rejecting current being induced into the drain of M31 via node 304 or the voltage supply node 124. Therefore, the current mirror 308 is configured to increase an output impedance looking into the drain 304 of the first transistor M31 via the same feedback circuit that rejects power supply noise, node 124, from stimulating current to the drain of M31, $I_{out}$.

Figure 4:
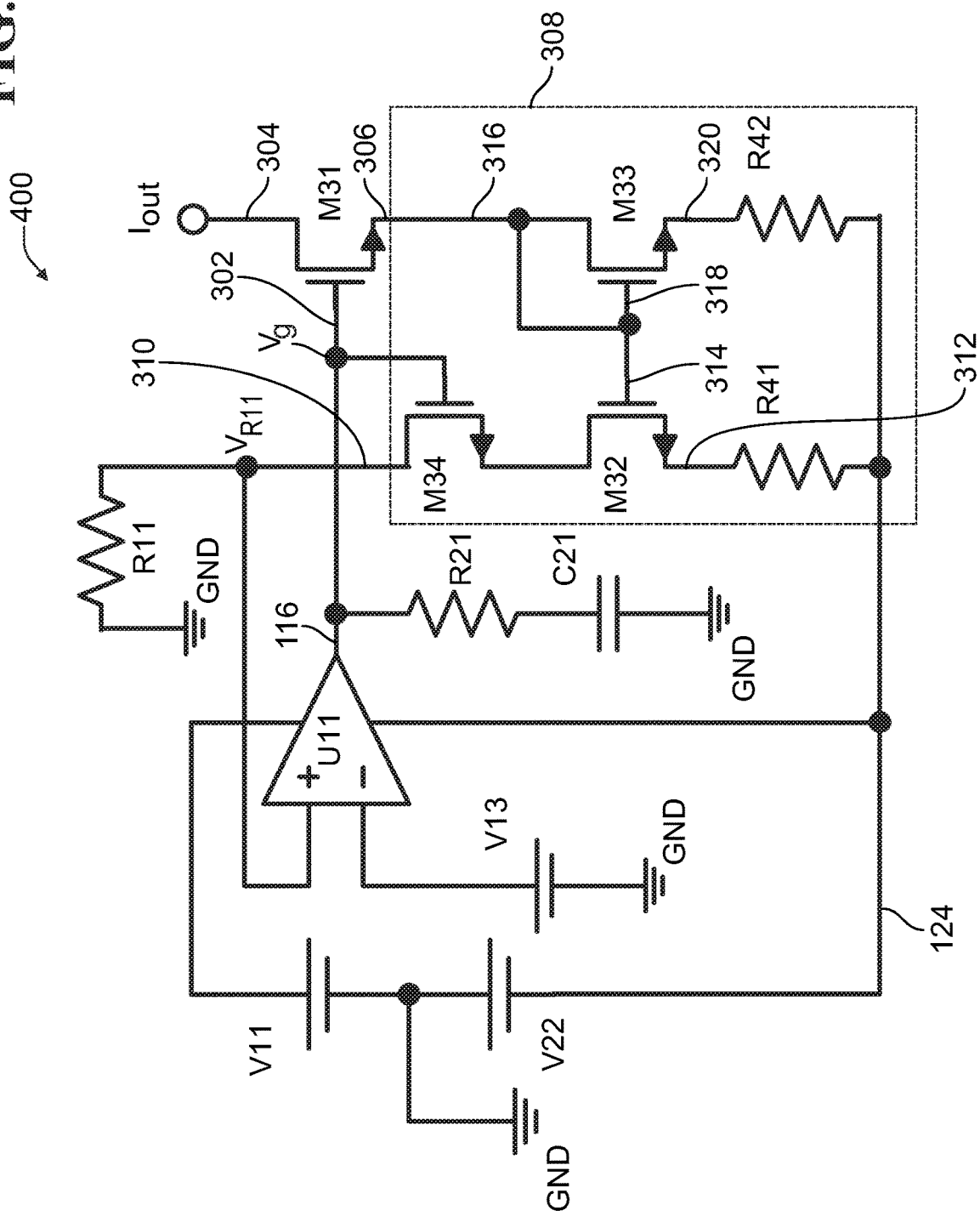
FIG. 4 is a circuit diagram of still yet another exemplary supply-noise-rejecting current source.

Referring now to FIG. 4, still another exemplary supply-noise-rejecting current source 400 is shown. This circuit operates substantially the same to the above circuit shown in FIG. 3, but adds resistors to the sources of transistor M32 and M33 to allow additional design flexibility. The current source 400 comprises the ground reference node GND, the voltage sources V11, V22, the control voltage source V13, the op-amp U11, the feedback resistor R11, the first transistor M31, the resistor R21 and the capacitor C21, connected as described above with respect to FIG. 3. The current source 400 further comprises a resistor R41 that is connected between the source 312 of the second transistor M32 such that the source 312 of the second transistor M32 is connected to the negative terminal 124 of the voltage supply V22 through the resistor R41. The current source 400 also includes a resistor R42 that is connected between the source 320 of the third transistor M33 such that the source 320 of the third transistor is connected to the negative terminal 124 of the voltage supply V22 through the resistor R42. The fourth transistor M34 is therefore configured to feed-back supply noise induced current from the supply V2, 124, to the feedback resistor R11 via a drain, 310, whereupon the op-amp U11 is connected to $V_g$, the gate 302 of the first transistor M31. The resistors R42 and R41 can be used to reduce electronics noise associated with the transistors M31-M33 and M34, respectively, while increasing the output impedance of M31.

Figure 5:
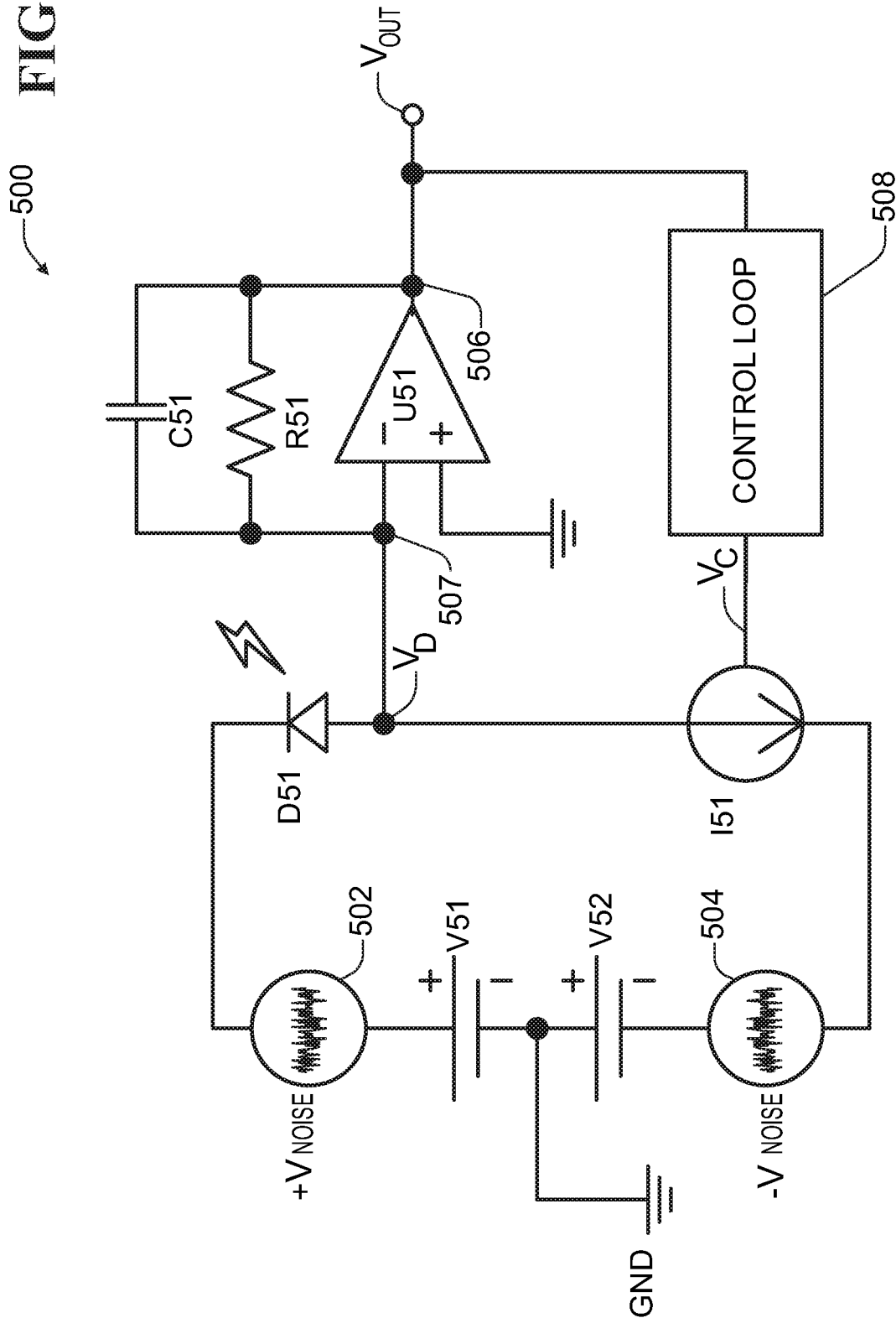
FIG. 5 is a block circuit diagram illustrating an exemplary photodiode amplifier application for embodiments of the supply-noise-rejecting current source.

Referring now to FIG. 5, an exemplary application of a supply-noise-rejecting current source in a photodiode amplifier circuit 500 is illustrated. The photodiode amplifier circuit 500 comprises a positive voltage source V51 with its negative terminal connected to ground and a negative voltage source V52 with its positive terminal connected to ground. The positive voltage source V51 and the negative voltage source V52 each exhibit some supply noise modeled as the voltage sources 502 and 504, respectively. The circuit 500 further comprises a photodiode D51 connected to the positive voltage source V51 (shown in FIG. 5 with the photodiode D51 connected to the modeled noise source 502) and to a low-noise amplifier U51. As shown in FIG. 5, the low-noise amplifier U51 is configured as a transimpedance amplifier where the gain is controlled by a resistor R51 and capacitor C51, the resistor R51 and the capacitor C51 connected in parallel between an output terminal 506 of the low-noise amplifier U51 and an inverting input terminal 507 of the low-noise amplifier U51. The circuit 500 additionally includes a supply-noise-rejecting voltage-controlled current source I51 that is connected at a first terminal to the diode D51 and the low-noise amplifier U51 and is connected at a second terminal to the negative voltage source V52 (shown in FIG. 5 with the current source I51 connected to the modeled noise source 504). The current source I51 is controlled by a voltage output $V_C$ of a control loop 508 connected to the low-noise amplifier U51. The control loop 508 is configured to set the current output of the current source I51 equal to the low frequency background current of the photodiode D51 by feedback of the output of the low-noise amplifier U51 to the source I51. With the output of the current source I51 controlled to equal the low frequency background current of the photodiode D51, higher frequency current in the photodiode D51 will be amplified by the low noise amplifier U51. The supply-noise-rejecting current source I51 has high impedance looking into both of its terminals, and thus the current source I51 does not pass noise from the negative voltage source V52 onto the node $V_D$ that connects the photodiode D51 and the current source I51, and therefore will not be amplified by the low noise amplifier U51 to $V_{OUT}$. If I51 were replaced with a conventional current source, the relatively low impedance of the conventional current source looking into the terminal connected to the negative voltage supply V52 would allow noise to be passed onto the node $V_D$, which would be amplified by the amplifier U51 and therefore passed with gain to the output $V_{OUT}$ of the photodiode amplifier circuit 500. The supply-noise-rejecting current source I51 is therefore useful in certain applications where the relatively low impedance of one side of a conventional current source renders the conventional current source unsuitable.

It will be apparent to one of skill in the art that while the transistors are shown as NMOS transistors in the exemplary systems 100, 200, 300, and 400 described herein, the systems 100, 200, 300, and 400 and other systems can be implemented in accordance with the technologies described herein using other types of transistors. For example, with minor modifications the systems 100, 200, 300, 400 can be implemented with N or P type transistors, MOS, JFETs, BJTs, etc., depending on the desired polarity of the current source output.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A current source configured to output a substantially constant current, comprising:
    an operational amplifier (op-amp);
    a feedback resistor connected to an input of the op-amp and a ground reference node;
    a first transistor that sources current from a supply, wherein a source or a drain of the first transistor is an output terminal of the current source;
    a second transistor configured to feed-back supply noise to the feedback resistor, wherein responsive to the second transistor feeding back the supply noise to the feedback resistor, the op-amp outputs the supply noise to a gate of the first transistor;
    an operational bandwidth network, the operational bandwidth network including:
        a second resistor; and
        a capacitor connected in series with the second resistor, a first terminal of the operational bandwidth network connected to the output of the op-amp, wherein an operational bandwidth of the current source is based upon a resistance value of the second resistor and a capacitance value of the capacitor;
    wherein a second input of the op-amp is connected to a control voltage source, the control voltage source further connected to the ground reference node; and
    wherein the substantially constant current depends upon a resistance value of the feedback resistor and a voltage output of the control voltage source.

2. The current source of claim 1, wherein the current source is a voltage-controlled current source.

3. The current source of claim 1, further comprising a third transistor, the third transistor forming a current mirror with the second transistor, the current mirror configured to feed back a stimulation received at the output terminal of the current source to the feedback resistor.

4. The current source of claim 1, further comprising a third transistor, the third transistor forming a current mirror with the second transistor, the current mirror configured to increase an output impedance of the current source at the output terminal of the current source.

5. The current source of claim 4, wherein a source of the second transistor is connected directly or through a third resistor to the supply, wherein further a source of the third transistor is connected directly or through a fourth resistor to the supply, a gate of the third transistor is connected to a gate of the second transistor, and a drain of the third transistor is connected to the source of the first transistor.

6. The current source of claim 4, further comprising a fourth transistor, the fourth transistor cascoding the second transistor forming a symmetrical voltage-balanced current mirror.

7. The current source of claim 1, wherein the op-amp comprises an operational transconductance amplifier (OTA).

8. The current source of claim 1, wherein the source of the first transistor is connected to the supply and the drain of the first transistor is the output terminal of the current source, and wherein a gate of the second transistor is connected to an output of the op-amp, a source of the second transistor is connected to the supply, and a drain of the second transistor is connected to the input of the op-amp.

9. The current source of claim 1, wherein the first transistor and the second transistor are NMOS transistors.

10. The current source of claim 1, wherein the first transistor and the second transistor are PMOS transistors.

11. The current source of claim 1, wherein a drain of the second transistor is connected to the input of the op-amp, and wherein responsive to a change in the supply voltage, an output voltage at an output of the op-amp drives the first transistor to maintain the substantially constant current.

12. A current source, comprising:
an operational amplifier (op-amp);
a control voltage source connected to a first input of the op-amp and a ground reference node;
a feedback resistor connected to a second input of the op-amp and the ground reference node;
a first transistor, wherein a gate of the first transistor is connected to an output of the op-amp and a source of the first transistor is connected directly or through a current mirror to a voltage supply, wherein a drain of the first transistor is an output terminal of the current source;
a second transistor configured to feed-back supply noise to the feedback resistor, wherein responsive to the second transistor feeding back the supply noise to the feedback resistor, the op-amp outputs the supply noise to the gate of the first transistor;
a capacitor connected to the ground reference node; and
a resistor connected to the capacitor and the output of the op-amp, wherein the resistor and the capacitor define a noise bandwidth of the current source.

13. The current source of claim 12, further comprising:
a second resistor, the second resistor connected between the source of the first transistor and the voltage supply such that the source of the first transistor is connected to the voltage supply through the second resistor directly or through the current mirror; and
a third resistor, the third resistor connected between the source of the second transistor and the voltage supply such that the source of the second transistor is connected to the voltage supply through the third resistor.

14. The current source of claim 12, wherein the current source outputs the substantially constant current based upon a resistance value of the feedback resistor and a voltage output of the control voltage source.

15. The current source of claim 12, further comprising a third transistor, the third transistor forming the current mirror with the second transistor, the current mirror configured to increase an output impedance of the current source at the output terminal of the current source.

16. The current source of claim 15, further comprising a fourth transistor, the fourth transistor cascoding the second transistor forming a symmetrical voltage-balanced current mirror.

17. A current source configured to output a substantially constant current, comprising:
an operational amplifier (op-amp);
a feedback resistor connected to an input of the op-amp and a ground reference node;
a first transistor that sources current from a supply, wherein a drain of the first transistor is an output terminal of the current source; and
a second transistor configured to feed-back supply noise to the feedback resistor, wherein responsive to the second transistor feeding back the supply noise to the feedback resistor, the op-amp outputs the supply noise to a gate of the first transistor;
wherein a source of the first transistor is connected directly or through a current mirror to the supply, and wherein a source of the second transistor is connected directly or through a second resistor to the supply.

18. The current source of claim 17, further comprising a third transistor, the third transistor forming the current mirror with the second transistor, the current mirror configured to increase an output impedance of the current source at the output terminal of the current source.

19. The current source of claim 18, further comprising a fourth transistor, the fourth transistor cascoding the second transistor forming a symmetrical voltage-balanced current mirror.

20. A current source, comprising:
an operational amplifier (op-amp);
a control voltage source connected to a first input of the op-amp and a ground reference node;
a feedback resistor connected to a second input of the op-amp and the ground reference node;
a first transistor, wherein a gate of the first transistor is connected to an output of the op-amp and a source of the first transistor is connected directly or through a current mirror to a voltage supply, wherein a drain of the first transistor is an output terminal of the current source;
a second transistor configured to feed-back supply noise to the feedback resistor, wherein responsive to the second transistor feeding back the supply noise to the feedback resistor, the op-amp outputs the supply noise to the gate of the first transistor;
a second resistor, the second resistor connected between the source of the first transistor and the voltage supply such that the source of the first transistor is connected directly or through the current mirror to the voltage supply through the second resistor; and
a third resistor, the third resistor connected between the source of the second transistor and the voltage supply such that the source of the second transistor is connected to the voltage supply through the third resistor.

* * * * *